(12) United States Patent
Nielsen

(10) Patent No.: US 12,210,051 B2
(45) Date of Patent: Jan. 28, 2025

(54) FAULT GAS DETECTION SYSTEM FOR A LIQUID FILLED HIGH VOLTAGE TRANSFORMER

(71) Applicant: Siemens Gamesa Renewable Energy A/S, Brande (DK)

(72) Inventor: Leif Nielsen, Brande (DK)

(73) Assignee: SIEMENS GAMESA RENEWABLE ENERGY A/S, Brande (DK)

( * ) Notice: Subject to any disclaimer, the term of this patent is extended or adjusted under 35 U.S.C. 154(b) by 143 days.

(21) Appl. No.: 18/024,099

(22) PCT Filed: Aug. 19, 2021

(86) PCT No.: PCT/EP2021/073029
§ 371 (c)(1),
(2) Date: Mar. 1, 2023

(87) PCT Pub. No.: WO2022/048918
PCT Pub. Date: Mar. 10, 2022

(65) Prior Publication Data
US 2023/0266378 A1    Aug. 24, 2023

(30) Foreign Application Priority Data

Sep. 4, 2020    (EP) .................................. 20194647

(51) Int. Cl.
*G01R 31/12*    (2020.01)
*F03D 7/00*    (2006.01)
(Continued)

(52) U.S. Cl.
CPC ........... *G01R 31/1281* (2013.01); *F03D 7/00* (2013.01); *G01F 23/02* (2013.01); *G01F 23/18* (2013.01);
(Continued)

(58) Field of Classification Search
CPC ....... G01R 31/1281; F03D 7/00; G01F 23/02; G01F 23/18; G01F 23/68; H01F 27/14;
(Continued)

(56) References Cited

U.S. PATENT DOCUMENTS

2008/0127714 A1*  6/2008  Altmann ............ G01N 33/2841
                                                 73/19.1
2013/0158897 A1*  6/2013  Jain ...................... H01F 27/402
                                                 702/42

FOREIGN PATENT DOCUMENTS

DE           19822868 C1    9/1999
EP           3367399 A      8/2018
(Continued)

OTHER PUBLICATIONS

PCT International Preliminary Report on Patentability mailed Nov. 25, 2022 corresponding to PCT International Application No. PCT/EP2021/073029 filed Aug. 19, 2021.
(Continued)

*Primary Examiner* — Amy He
(74) *Attorney, Agent, or Firm* — Schmeiser, Olsen & Watts LLP

(57) ABSTRACT

A fault gas detection system for a liquid filled high voltage transformer, the transformer including a main tank and an expansion tank the tanks fluidic connected by an exchange conduit such that gas and/or a transformer liquid is able to exchange between the tanks, the gas detection system including: a chamber with a top cover,
  a predefined horizontal level-plane in the chamber defining a maximum liquid level of a transformer liquid in the chamber during use,
  a fluid-channel including a fluid-egress at a level equal to or higher than the top cover and a fluid-ingress lower than the level of the level-plane,
(Continued)

a level sensor designed to measuring and/or indicating a liquid level.

A respective transformer and a respective wind turbine system is also provided.

11 Claims, 3 Drawing Sheets

(51) Int. Cl.
    *G01F 23/02*     (2006.01)
    *G01F 23/18*     (2006.01)
    *H01F 27/14*     (2006.01)
    *H01F 27/40*     (2006.01)

(52) U.S. Cl.
    CPC ........... *H01F 27/14* (2013.01); *H01F 27/402* (2013.01); *F05B 2270/30* (2013.01); *H01F 2027/404* (2013.01)

(58) Field of Classification Search
    CPC ............. H01F 27/402; H01F 2027/404; F05B 2270/30
    See application file for complete search history.

(56) References Cited

FOREIGN PATENT DOCUMENTS

| | | |
|---|---|---|
| JP | 2014179471 A | 9/2014 |
| JP | 2015046458 A | 3/2015 |

OTHER PUBLICATIONS

Elektromotoren und Gerätebau Barleben GmbH: "Technical Documentation—Gas Relay for Transformers"; CF38_EN.

Abb "Gas Detector Relay: Model 11 and Model 12 (Technical Guide)"; 1ZUA5663-211, Aug. 22, 2008.

\* cited by examiner

FAULT GAS DETECTION SYSTEM FOR A LIQUID FILLED HIGH VOLTAGE TRANSFORMER

CROSS-REFERENCE TO RELATED APPLICATIONS

This application claims priority to PCT Application No. PCT/EP2021/073029, having a filing date of Aug. 19, 2021, which claims priority to EP Application No. 20194647.2, having a filing date of Sep. 4, 2020, the entire contents both of which are hereby incorporated by reference.

FIELD OF TECHNOLOGY

The following relates to a fault gas detection system for a liquid filled high voltage transformer as well as a respective transformer and a wind turbine system.

BACKGROUND

For generating appropriate voltages for or from various high voltage ("HV") applications, generally transformers are used for transforming these voltages. They are typically able to transform a "normal" voltage to or from a high voltage. Voltages are designated as "high voltages" when they are above a certain threshold. The International Electrotechnical Commission and its national counterparts (IET, IEEE, VDE, etc.) define high voltage as above 1000 V for alternating current, and at least 1500 V for direct current.

A transformer comprises at least two coils, at least one primary coil and at least one secondary coil, and usually a magnet yoke, i.e. a yoke made of ferromagnetic material, e.g. iron, to lead an appropriate magnetic field. There could be various shapes and numbers of yokes. In the following the yoke or yokes are designated as "yoke-system" to cover all possible yoke configurations.

For HV-applications, transformers should warrant special safety requirements. To achieve this, typical HV-transformers comprise a combined system of insulation materials on the wires of their coils and an insulation liquid surrounds the coils and yoke-system of the transformer. To securely prevent voltage flashovers, the coils have to be completely covered with the insulation liquid (in the following called "transformer liquid" or simply "liquid"). Such transformers usually comprise a tank (called "main tank" in the following), where the coils of the transformer are submerged in insulator liquid.

One serious problem is the emerging of gases in the liquid due to electrical faults of the generator (e.g. flashovers or problems of the insulation or the wires of the coils). Due to electrolysis, there may be generated gas from the insulation liquid that is in the following called "fault gas" or simply "gas". These gas may lead to an increase of pressure in the main tank that could damage or destroy the main tank, if there is no gas exhaust.

An exemplary embodiment preventing a dangerous increase of pressure is a transformer called "Open system". Such transformer is free breathing to the environment air. This means that it allows at least an exhaust of gas between the main tank to the environment.

A typical open system transformer consists of two tanks. In the main tank, usually the biggest tank, there are the coils and yoke-system of the transformer which provide the voltage-transformation. One smaller tank (called "expansion tank") is arranged on top of the main tank. Besides that, advantageous effect against gas-pressure, this tank also compensates thermal pressure effects, i.e. rise and fall of the pressure due to thermal expansion or contraction of the insulator liquid when temperature is rising or falling.

The expansion tank is fluidly connected to the main tank through an exchange conduit and further comprises an exhaust opening to the environment. Gas produced in the main tank flows through the exchange conduit in the expansion tank and could emerge into the environment through the exhaust opening. Furthermore, this exhaust opening allows the expansion tank to "breathe" the expansion or contraction of the air inside the expansion tank when liquid is expanding or contracting.

Thus, fault gas can escape through the holes to the free air, what prevents the danger of fatal pressure inside the main tank.

However, on the other hand, there is no warning that there occurred and electrical fault inside the transformer, since the fault gas is emitted automatically and undetected.

To detect the occurrence of fault gas, there are commercial sensor-elements which can be used for detection. They can be found under the designations "Gas Relay for Transformers" or "Gas Detector Relay". However, such sensor-elements are relatively expensive and their use and installation is relatively complicated.

SUMMARY

An aspect relates to improve the known systems, devices and methods to facilitate an improvement in detecting the emergence of fault gas in a high voltage transformer.

A fault gas detection system according to embodiments of the invention is applicable for a liquid filled high voltage transformer. The transformer comprises two tanks, a main tank and an expansion tank, wherein the tanks are fluidic connected by an exchange conduit such that gas and/or a transformer liquid is able to exchange between the tanks.

The main tank is usually the lowest and biggest tank. In this tank are the coils and the yoke, which are used for the transformation of voltage. To ensure high-voltage insulation of the parts, there is used a combined system, comprising insulation materials on the wires and an insulation liquid ("transformer liquid").

The expansion tank is usually smaller than the main tank and arranged over or on top of the main tank. Expansion of the insulation liquid will happen when temperature is rising and similar contraction of the liquid will happen when temperature is falling. The expansion tank is connected to the main tank by an exchange conduit. There is an exhaust opening leading from the expansion tank to the free air, so that the expansion tank can "breathe", i.e. compensate the expansion or contraction of the fluids inside the expansion tank and the main tank.

If an electrical fault happens in the coils, there is usually a production of "fault gas". As said above, according to the state of the art, these fault gas can escape through the exchange conduit and the exhaust opening. Thus, a technician of the transformer does not get a warning that there was an electrical fault inside transformer.

The Idea of embodiments of this invention is to prevent the automatic exhaust of fault gas, but accumulate the fault gas and use this accumulation for a measurement or an indication of a warning.

The gas detection system comprises the following components:

A chamber with a top cover.

This chamber is designed such that it can comprise a portion of the transformer liquid and should be arranged such that fault gas produced in or from the transformer liquid is able to ascend into the chamber. For example, the chamber is the main tank (or arranged in the main tank), where the fault gas is produced. The chamber may also be a chamber different to the main tank, e.g. a chamber placed over or on the main tank having a conduit at its lower portion to the main tank so that gas emerging in the main tank is able to flow into the chamber. The chamber may also be a protrusion in the lid of the main tank. The top cover covers the top of the whole chamber so that gas in the chamber is not able to rise out of the chamber without controlled exhaust.

A predefined horizontal level-plane in the chamber defining a maximum liquid level of a transformer liquid in the chamber during use.

Since transformer liquid is not necessary a component of embodiments of the invention, there is needed a theoretical plane, the level-plane, that defines, where normally (during use of the transformer) there is the maximum liquid level of the transformer liquid. Typically, the level-plane is at the bottom side of the top cover so that liquid fills the whole chamber at maximum liquid level. However, there may also be a vertical space between the top cover and the level-plane, however only of the dimensions of mm or at least smaller than 5 cm. In the case the chamber is the main tank, the level-plane is the bottom side of the top lid of the main tank, since the main tank should be completely filled with liquid.

A fluid-channel comprising a fluid-egress at a level equal to or higher than the top cover and a fluid-ingress lower than the level of the level-plane.

The fluid-channel is, therefore, an elongated channel, since its one end (fluid egress) is up in the top cover and its other end (fluid ingress) is down below the level-plane (that is the bottom side of the top cover). It is a pipe positioned vertically. Its ingress (e.g. the bottom face of the pipe) lies more than 1 cm below the level-plane, preferably more than 5 cm, in order to provide enough space for a fluid level to variate. However, since a dropping of the fluid level results in a rise of pressure and a rise of fluid level in the expansion tank, the ingress should be not lower than 1 m below the level-plane, especially not lower than 50 cm, especially not lower than 20 cm. It should be noted that a rise of liquid in the expansion tank could result in liquid leaking out of the exhaust opening. Thus, the fluid-ingress should not be lower than a position, where transformer liquid may leak out of the exhaust opening.

Thus, this chamber is filled with transformer liquid and designed such that gas rising in the chamber to the top cover will accumulate there. This accumulation occurs since the gas cannot escape out of the chamber, because the fluid-ingress of the fluid-channel (the only opening in the top cover that is open during normal use (normal: measuring the liquid level). Due to the accumulation of the gas under the top cover, the liquid level will drop, since liquid is pressed out of the fluid-channel, especially into another chamber, e.g. the expansion tank or a proportion of the expansion tank. Thus, by measuring or indication the liquid level, production of fault gas can be measured or indicated.

A level sensor designed to measuring and/or indicating a liquid level.

The level sensor may be a simple window in the chamber, where one can see the liquid level. However, it can also comprise a floater and an indicating element, wherein the indicating element should be seen from the outside or deliver a measuring signal of the liquid level. Since the liquid emerging through the fluid-channel should not leave the transformer, but rise in an expansion tank, there will occur a pressure rise with the dropping of liquid level. Thus, the level sensor may also be a pressure indicator or measuring element. It is preferred that level sensor is not only detecting a decrease of liquid level, but that the system is also designed to generate a warning if the liquid level drops below a predefined threshold. For example, if the liquid level in the main tank drops 15 mm below the level-plane, then the system should provide a warning signal. It is preferred that the level sensor is arranged in or on the chamber. However, it can be also preferred that the level sensor is arranged at another position fluidly connected with the chamber.

Since the gas production drops the liquid level, and the liquid level is indicated by the level sensor, the level sensor indicates or measures the production of fault gas and is an indicator for faults in the transformer. To exhaust the gas, a service technician could open the top cover and possibly measure the nature of this gas for further information about the fault of the transformer. However, gas exhaust can also be controlled by an additional gas egress in the top cover that may be opened manually or doe to an opening mechanism. It is preferred that gas is emitted controlled and not automatically, since it can be necessary to make a sample of the gas to find the fault type which has happened in the transformer.

Embodiments of this invention are very advantageous for a high voltage transformer of the above mentioned type "Open system". This means that a transformer free breathing to the environment air can be modified according to embodiments of the invention. The pressure in such "Open System" transformers is very low due to the possibility of gas exhaust. Such transformers are described in the following.

A high voltage transformer according to embodiments of the invention comprises the following components:

At least two transformer coils and a yoke system (in order to actually be a transformer).

A main tank containing the transformer coils (and the yoke) and comprising a top lid, wherein the main tank is designed to incorporate a transformer liquid with a predefined maximum liquid level.

It should be noted that a transformer does typically not comprise the transformer liquid until it is installed and used. The maximum liquid level is predefined (e.g. due to safety requirements) and typically the bottom side of the top lid in the main tank, since the main tank should be completely filled.

An exchange conduit in the main tank.

This is the conduit where transformer liquid is able to emerge out of the main tank into an expansion tank if pressure rises in the main tank.

An expansion tank arranged on or over the main tank and fluidic coupled to the exchange conduit (so that at least transformer liquid could flow from one tank through the exchange conduit into the other tank), the expansion tank comprising an exhaust opening and being designed such that this exhaust opening lies above the exchange conduit and over a predefined maximum liquid level in the expansion tank.

A fault gas detection system.

This system may be arranged in the main tank or in the expansion tank or at a separate position.

The system or the transformer may be installed in a facility that needs energy and has to transform high voltage to a "normal" voltage appropriate to power machines. The system or the transformer also may be installed in a facility that produces energy and has to transform the voltage produced to high voltage for conducting it over large distances. One special application is the use of such transformer or system in a system of a wind turbine.

A wind turbine system according to embodiments of the invention comprises a wind turbine, a control system for the wind turbine and a system according to embodiments of the invention, especially a transformer according to embodiments of the invention. It is preferred that the control system is connected to the level sensor such that it receives measurements of the level sensor and the control system is designed such that it uses these measurements for controlling the wind turbine system.

Thus, embodiments of the invention provide a simple, low cost solution to detect fault gas inside a liquid filled high voltage transformer. This is a new detection coming up because of making cost out on high voltage transformer to having much cheaper materials and also less robust materials. This detection will give a first warning that some failure situation is coming in near future. And actions can be taken to analyze more deeply.

According to a preferred fault gas detection system, the camber is the main tank and the top cover is the top lid of the main tank. It is preferred that the fluid channel is the exchange conduit between the main tank and the expansion tank. Since the level sensor measures the liquid level especially in the chamber, the level sensor is also arranged in the main tank. However, since the liquid level will rise in the expansion tank with a higher value than it will drop in the main tank (due to the typical smaller volume of the expansion tank), the level sensor may also be arranged in the expansion tank, wherein in this case it is advantageous to respect thermal dilatation of the transformer liquid.

According to a preferred fault gas detection system, the camber is arranged in the expansion tank and the top cover is an intermediate ceiling in the expansion tank below its exhaust opening to the environment. It is preferred that the fluid channel is a conduit in the intermediate ceiling between the chamber and a proportion of the main tank comprising the exhaust opening. The level sensor is in the expansion tank, wherein in this case it is advantageous to respect thermal dilatation of the transformer liquid.

According to a preferred fault gas detection system, the level sensor is designed to measure and/or indicate the liquid level by swimming on the liquid. Alternatively or additionally, the level sensor is designed to measure and/or indicate the liquid level by activating it by pressure inside the system due to a rising liquid level in the transformer (e.g. in the expansion tank).

According to a preferred fault gas detection system, the exchange conduit is arranged in the top cover, in a central part and/or at an end part of the top cover.

According to a preferred fault gas detection system, the system is designed that the position of the level sensor can be seen from the outside, e.g. through a window or another transparent portion of the camber, and/or that the level sensor provides an electric signal that is a measure for its actual position.

According to a preferred fault gas detection system, the fluid channel comprises a pipe vertically arranged such that its one face acts as fluid-egress and is positioned at a level equal to or higher than the top cover and its other face acts as fluid-ingress and is positioned lower than the level of the level-plane.

According to a preferred high voltage transformer, the exchange conduit is designed as fluid channel, especially in form of a pipe, preferably such that its entry in the main tank lies under a predefined maximum liquid level (representing the liquid level for regular use of the transformer) and wherein the main tank comprises the level sensor, that is used for measuring and/or indicating the liquid level in the main tank during use of the transformer.

According to a preferred high voltage transformer, the expansion tank is separated by an intermediate ceiling below the exhaust opening in an upper compartment and a lower compartment lying upon another, wherein the lower compartment is the chamber and the intermediate ceiling is the top cover of the fault gas detection system, preferably wherein the fluid channel is a conduit between the intermediate ceiling and the upper compartment.

A preferred system comprises a controlled gas exhaust in an area where gas is intended to be accumulating, especially in the area, where the level sensor is positioned. This gas exhaust could be a valve or a tap or any other aperture which outlet can be controlled. The control should be rendered such that after the signal of the level sensor reaches a certain threshold, the gas exhaust is automatically opened. This is advantageous, since the liquid rises due to gas production in the expansion tank and could leak out after it reaches a certain level. However, depending on the application it is preferred that for opening the gas exhaust first a manual confirmation has to occur. Furthermore, it is advantageous to log the signals of the level sensor and the opening of the gas exhaust over time, because then the total sum of produced gas during a certain time can be calculated.

The top cover may be horizontal. However, for some embodiments it may be advantageous if the top cover is inclined or comprises inclined portions so that gas accumulated there may flow to defined collecting areas.

One main advantage of embodiments of the invention is, that it results in a simple low cost solution to easily and reliably detect fault gas inside a liquid filled high voltage transformer.

Concerning known sensor applications, this solution needs much cheaper and also less robust materials. The signals of the level sensor will provide at least a first warning that some failure situation may occur in near future and actions can be taken to analyze the situation more deeply. Further advantages are that embodiments of this invention can easily be incorporated as amendments of the design of a transformer tank, that embodiments of this invention does not necessarily need any calibration, that embodiments of this invention is easily understood by non-technicians and that errors of the sensor can be found easily.

BRIEF DESCRIPTION

Some of the embodiments will be described in detail, with reference to the following figures, wherein like designations denote like members, wherein.

DETAILED DESCRIPTION

Figure 1:
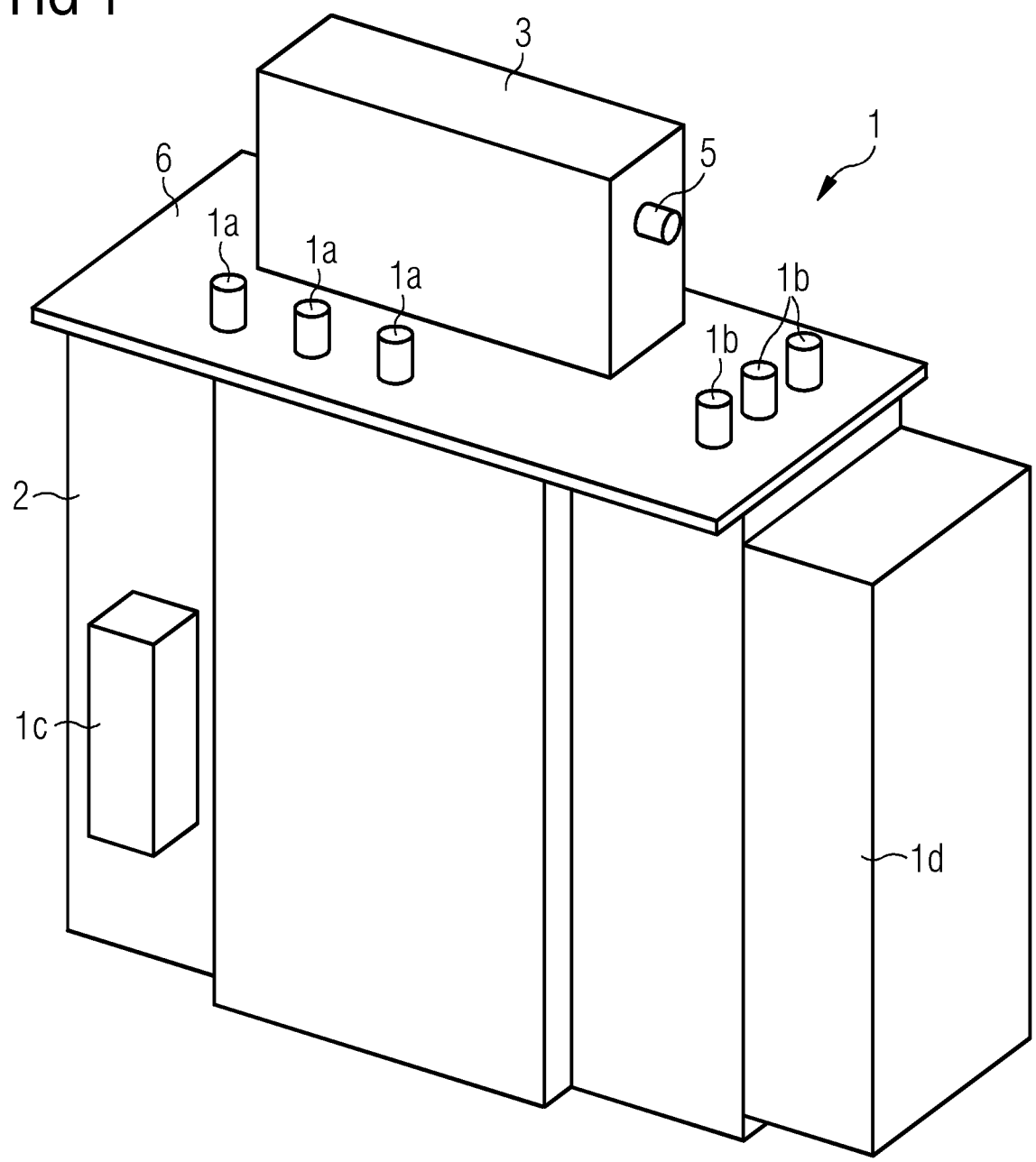
FIG. 1 shows a perspective view of a typical setup for a high voltage transformer.

FIG. 1 shows a typical setup of a high voltage transformer 1 from the outside. The main components visible are the main tank 2, where the coils and the yoke are submerged in transformer liquid. The coils and the yoke are not shown, since they are not important to understand embodiments of the present invention. A high voltage facility can be connected to the high voltage terminal 1*a* (in this example three connectors for different phases) and a normal voltage facility can be connected to the low voltage terminal 1*b* (also three connectors for different phases). The transformer can theoretically work two ways: high voltage can be converted from normal voltage, e.g. for transport over power lines, or normal voltage can be converted from high voltage, e.g. to power a machine. As auxiliary systems there are shown a breather 1*c* and a cooling unit 1*d*, both commonly known by the artisan and not important to understand embodiments of the invention.

On the top lid 6 of the main tank, there is an expansion tank 3 with an exhaust opening 5 for pressure equalization. The main tank 2 and the expansion tank 3 are fluidic connected by an exchange conduit 4 that is here hidden due to perspective, but can be seen in the following figures.

Typically, the main tank 2 is completely filled with transformer liquid TL and the expansion tank 3 is partly filled with transformer liquid TL to a liquid level L shown by the dashed line in the expansion tank 3 in the following figures. There is an exhaust opening 5 in the expansion tank 3, where the transformer 1 can "breathe" to the surrounding air.

Figure 2:
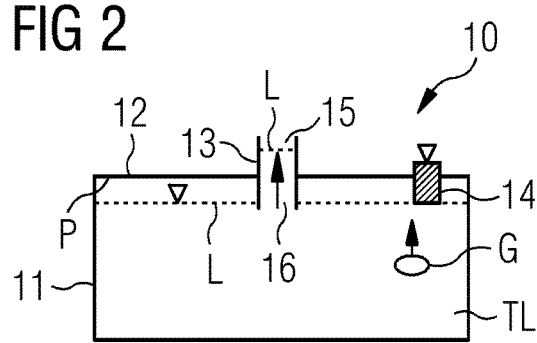
FIG. 2 shows a simplified example for a fault gas detection system according to an embodiment of the invention.

FIG. 2 shows a simplified example for a fault gas detection system 10, according to an embodiment of the invention, for a liquid filled high voltage transformer 1 as e.g. shown in FIG. 1. The fault gas detection system 10 comprises a chamber 11 with a top cover 12, a pipe 13 used as fluid channel 13 and a level sensor 14. A horizontal level-plane P is here defined in the area of the top cover 12 that means that a transformer liquid TL could completely fill the volume of the chamber 11. The fluid-channel 6 comprises a fluid-egress 15 at a level higher than the top cover and a fluid-ingress 16 lower than the level of the level-plane P (i.e. here the plane of the top cover 12).

In case of some electrical fault inside the windings of the transformer 1 (the coils placed in the main tank 2), there fault gas G will be produced. The fault gas G will ascend as it is indicated with gas bubbles G rising in the transformer liquid (see arrow at the gas bubble G). The gas will gather on top of the transformer liquid TL at the top cover 12 and press the transformer liquid TL down (see arrows pointing down). Thus, the liquid level L in the chamber 11 is sinking the more gas bubbles G are produced in the chamber 11. Due to the rising pressure in the chamber 11, the transformer liquid TL flows up the pipe 13 (see arrow pointing up the pipe 13).

A level sensor 14 swimming on the transformer liquid TL in the chamber 11 will sink down together with the sinking liquid level L in the chamber. Thus, the position of the level sensor 14 measures or indicates the liquid level L. Shown here is a state, where the liquid level L is near the fluid-ingress 16 of the pipe 13. When the liquid level L sinks below the horizontal plane of the fluid-ingress 16, gas will flow out and the liquid level L won't sink any more. This is advantageous, since then elements (e.g. coils) submerged in the fluid won't rise above liquid level L. Thus, the liquid level L will always be in the area of the level-plane P. It should be noted that the level sensor 14 can also be arranged such that it measures the liquid level L rising in the pipe 13 or in an additional tank on top of this pipe 13.

Figure 3:
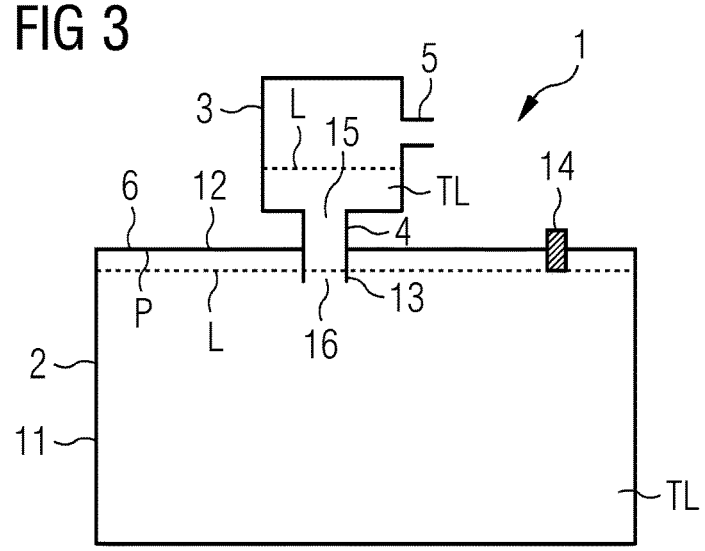
FIG. 3 shows a simplified example for a high voltage transformer with a fault gas detection system according to an embodiment of the invention.

FIG. 3 shows a simplified example for a high voltage transformer 1 with a fault gas detection system 10 according to an embodiment of the invention (see e.g. FIG. 2 in principle). Here the fault gas detection system 10 is not indicated with a reference sign, since its components are distributed in the transformer 1. In this example, the components of the fault gas detection system 10 are here arranged in the main tank 3 of the transformer 1.

The chamber 11 is here the main tank 2 and the top lid 6 of the main tank 2 is the top cover 12 of the chamber. The horizontal level-plane P is in this example, the bottom side of the top lid 6, what is the maximum liquid level L of a transformer liquid TL during normal use. The exchange conduit 4 between the main tank 2 and the expansion tank 3 of the transformer 1 is here the fluid-channel 13 that is formed by a pipe 13 with a fluid-egress 15 at a level higher than the top lid 6 (into the bottom of the expansion tank 3) and the fluid-ingress 16 is lower than the level of the level-plane P (i.e. the bottom side of the top lid 6). The level sensor 14 is here a swimmer that indicates the liquid level L (see dashed line).

With the pipe 13 mounted to the underside of the exchange conduit 4 (respectively the exchange conduit 4 formed as pipe 13), the fault gas G cannot escape into expansion tank 3 until a certain low liquid level L is reached. Thus, the fault gas G will accumulate at the underside of the top lid 6 of the main tank 2. The accumulated fault gas G will press the liquid level L down, so the main tank 2 will not be filled with transformer liquid TL to the maximum liquid level L anymore. Thus, the liquid level L will decrease, what is registered by the level sensor 14.

To monitor the liquid level L, a simple level sensor 14 can be used that has a floater, which will go down when the liquid level L decreases in main tank 2. Thus, to monitor the production of fault gas G, the liquid level L can be used and measured with the level sensor 14. The level sensor 14 can produce an electric signal, e.g. a value of the height of the liquid level L at a certain time, or be a visual indicator, e.g. be seen through a window or another transparent part of the main tank 1. It should be noted that the level sensor 14 can also be arranged in the expansion tank 3. To monitor the liquid level L there, a simple level sensor 14 in form of a floater would go up when the liquid level L decreases in main tank 2. However, in this case, thermal effects (dilatation of transformer liquid TL) should be compensated.

The level sensor 14 can be connected to a control unit of a machine or a generator. For example, the level sensor 14 can be connected to a control system of a wind turbine as shown in FIG. 5.

Figure 4:
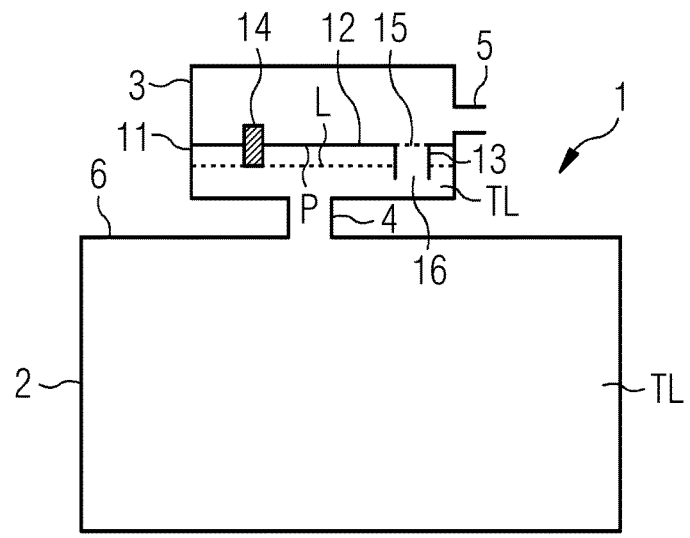
FIG. 4 shows another simplified example for a high voltage transformer with a fault gas detection system according to an embodiment of the invention.

FIG. 4 shows another simplified example for a high voltage transformer 1 with a fault gas detection system 10 according to an embodiment of the invention. Its general setup and working principle is similar to FIG. 3, with the difference that the components of the fault gas detection system 10 are here not distributed in the main tank 2, but in the expansion tank 3.

In this example, the expansion tank 3 is divided by an intermediate ceiling into two compartments upon another, wherein the chamber 11 is here the lower compartment of the expansion tank 3 and the top cover 12 is the intermediate ceiling. The horizontal level-plane P is in this example, the bottom side of the intermediate ceiling. In an opening in the intermediate ceiling there is formed a pipe 13 as fluid-channel 13 with a fluid-egress 15 at a level equal with the top cover 6 (the intermediate ceiling) and the fluid-ingress 16 is lower than the intermediate ceiling level of the level-plane P. The level sensor 14 is here a swimmer in the expansion tank 3 that indicates the liquid level L (see dashed line). One advantage of this embodiment is that the fluctuation of the liquid level L is stronger as it is when the main tank is used as chamber 11, due to the smaller volume of the chamber 11 here. However, thermal effects (dilatation of transformer liquid TL) should be compensated.

Figure 5:
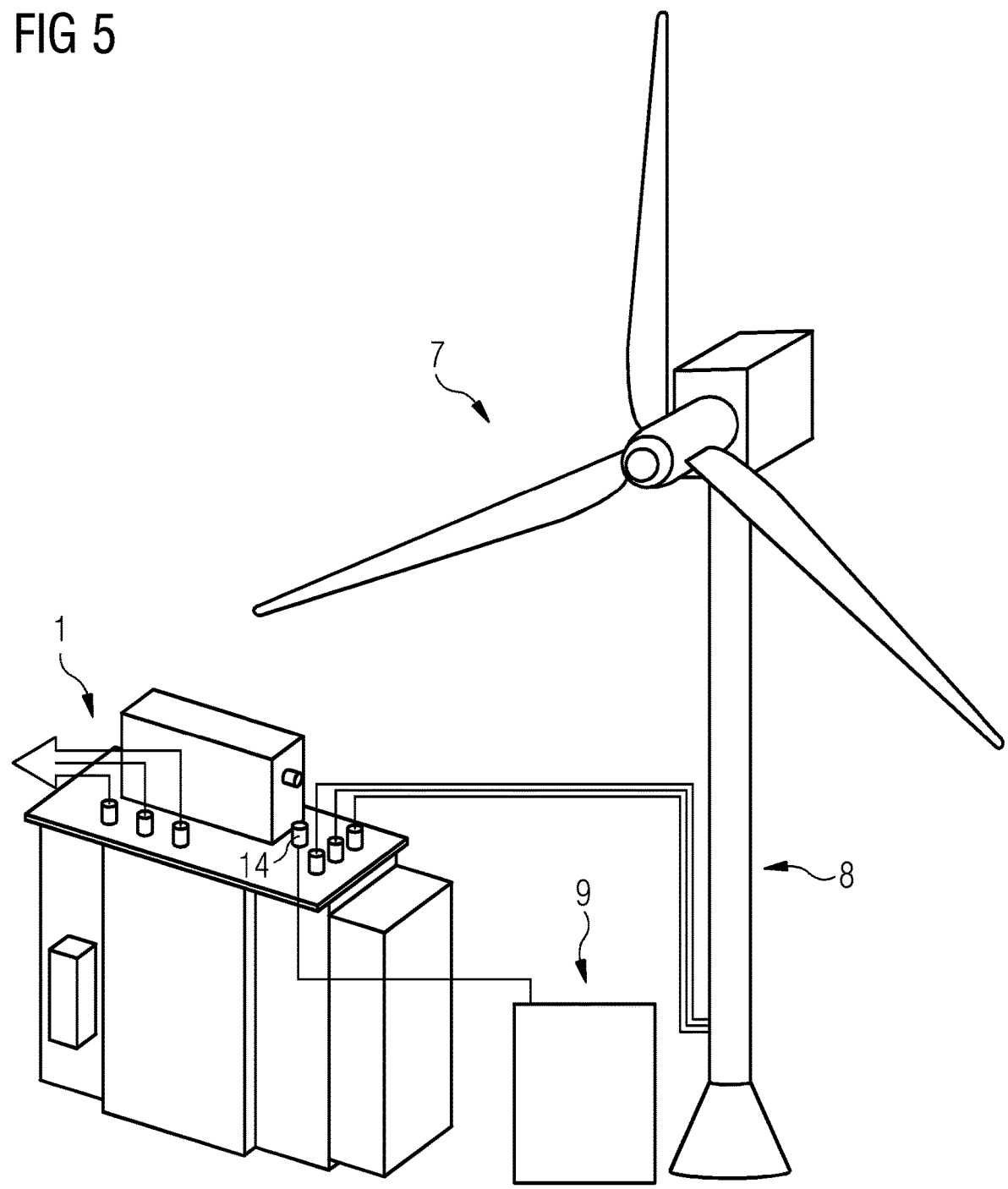
FIG. 5 shows a simplified wind turbine system.

FIG. 5 shows a simplified wind turbine system 7 comprising a wind turbine 8, a control system 9 for the wind turbine 8 and a high voltage transformer 1 according to embodiments of the invention. The transformer 1 transforms the voltage generated by the wind turbine 8 (three lines from the wind turbine 8) into a high voltage for conducting it over great distances (three lines ending in an arrow). The control system 9 is here connected to the level sensor 14 such that it receives measurements of the level sensor 14 and the control system 9 is designed such that it uses these measurements for controlling the wind turbine system 8.

Although the present invention has been disclosed in the form of embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A fault gas detection system for a liquid filled high voltage transformer, the transformer comprising a main tank and an expansion tank, the main tank and the expansion tank being fluidically connected by an exchange conduit such that a gas and/or a transformer liquid is able to exchange between the main tank and the expansion tank, the gas detection system comprising:
   a chamber with a top cover, wherein the chamber:
      a) is the main tank and the top cover is a top lid of the main tank, or
      b) is arranged in the expansion tank and the top cover is an intermediate ceiling in the expansion tank below an exhaust opening to an environment;
   a predefined horizontal level-plane in the chamber defining a maximum liquid level of the transformer liquid in the chamber during use;
   a fluid-channel comprising a fluid-egress at a level equal to or higher than the top cover and a fluid-ingress lower than the level of the level-plane; and
   a level sensor designed for measuring and/or indicating a liquid level in the chamber.

2. The fault gas detection system according to claim 1, wherein the fluid channel is the exchange conduit between the main tank and the expansion tank.

3. The fault gas detection system according to claim 1, wherein the fluid channel is a conduit in the intermediate ceiling between the chamber and a proportion of the expansion tank comprising the exhaust opening.

4. The fault gas detection system according to claim 1, wherein the level sensor is designed to measure and/or indicate the liquid level by swimming on the transformer liquid and/or by activating it by pressure inside the system due to a rising liquid level in the transformer.

5. The fault gas detection system according to claim 1, wherein the exchange conduit is arranged in the top cover, in a central part and/or at an end part of the top cover.

6. The fault gas detection system according to claim 1, wherein the system is designed that the position of the level sensor are seen from the outside, through a transparent portion of the chamber, and/or that the level sensor provides an electric signal that is a measure for an actual position.

7. The fault gas detection system according to claim 1, wherein the fluid channel comprises a pipe vertically arranged such that a first face acts as fluid-egress and is positioned at a level equal to or higher than the top cover and a second face acts as fluid-ingress and is positioned lower than the level of the level-plane.

8. A high voltage transformer comprising:
   at least two transformer coils and a yoke system;
   a main tank containing the transformer coils and comprising a top lid, the main tank designed for incorporating a transformer liquid with a predefined maximum liquid level;
   an exchange conduit in the main tank;
   an expansion tank arranged on or over the main tank and fluidically coupled to the exchange conduit, the expansion tank comprising an exhaust opening and being designed such that the exhaust opening lies above the exchange conduit and over a predefined maximum liquid level in the expansion tank;
   the fault gas detection system according to claim 1.

9. The high voltage transformer according to claim 8, wherein the exchange conduit is a pipe, such that an entry in the main tank lies under a predefined maximum liquid level, and wherein the main tank comprises the level sensor.

10. The high voltage transformer according to claim 8, wherein the expansion tank is separated by an intermediate ceiling below the exhaust opening in an upper compartment and a lower compartment lying upon another, wherein the lower compartment is the chamber and the intermediate ceiling is the top cover of the fault gas detection system, wherein the fluid channel is a conduit between the intermediate ceiling and the upper compartment.

11. A wind turbine system comprising a wind turbine, a control system for the wind turbine and the system according to claim 1, wherein the control system is connected to the level sensor such that measurements of the level sensor are received and the control system uses the measurements for controlling the wind turbine system.

* * * * *